US 7,117,465 B2

United States Patent
Khasidashvili et al.

(10) Patent No.: US 7,117,465 B2
(45) Date of Patent: Oct. 3, 2006

(54) APPLICATION OF THE RETIMED NORMAL FORM TO THE FORMAL EQUIVALENCE VERIFICATION OF ABSTRACT RTL DESCRIPTIONS FOR PIPELINED DESIGNS

(75) Inventors: Zurab Khasidashvili, Rishon le Zion (IL); John Moondanos, San Francisco, CA (US); Ziyad Hanna, Haifa (IL)

(73) Assignee: Intel Corporation, Santa Clara, CA (US)

(*) Notice: Subject to any disclaimer, the term of this patent is extended or adjusted under 35 U.S.C. 154(b) by 401 days.

(21) Appl. No.: 10/608,423

(22) Filed: Jun. 30, 2003

(65) Prior Publication Data

US 2004/0268274 A1 Dec. 30, 2004

(51) Int. Cl.
*G06F 17/50* (2006.01)

(52) U.S. Cl. .................... 716/5; 716/7; 716/3; 703/16; 703/2

(58) Field of Classification Search .............. 716/5, 716/7, 3; 703/2, 16
See application file for complete search history.

(56) References Cited

U.S. PATENT DOCUMENTS

| | | | | |
|---|---|---|---|---|
| 5,243,538 A | * | 9/1993 | Okuzawa et al. | 716/5 |
| 5,761,097 A | * | 6/1998 | Palermo | 702/79 |
| 6,035,109 A | * | 3/2000 | Ashar et al. | 716/3 |
| 6,247,163 B1 | * | 6/2001 | Burch et al. | 716/3 |
| 6,557,150 B1 | * | 4/2003 | Honmura et al. | 716/6 |
| 7,032,192 B1 | * | 4/2006 | Prasad et al. | 716/3 |
| 2003/0182638 A1 | * | 9/2003 | Gupta et al. | 716/4 |
| 2003/0182641 A1 | * | 9/2003 | Yang | 716/4 |
| 2003/0225552 A1 | * | 12/2003 | Ganai et al. | 703/2 |
| 2004/0098682 A1 | * | 5/2004 | Jain | 716/5 |
| 2004/0216078 A1 | * | 10/2004 | Roesner et al. | 716/18 |
| 2004/0216079 A1 | * | 10/2004 | Hunt et al. | 716/18 |
| 2004/0230407 A1 | * | 11/2004 | Gupta et al. | 703/2 |
| 2004/0237057 A1 | * | 11/2004 | Prasad et al. | 716/3 |
| 2005/0149301 A1 | * | 7/2005 | Gupta et al. | 703/2 |

FOREIGN PATENT DOCUMENTS

JP 2000155769 A * 6/2000

OTHER PUBLICATIONS

Chvatal et al., "Mick gets some (the odds are on his side) [satisfiability]", Proceedings of 33rd Annual Symposium on Foundations of Computer Science, Oct. 24, 1992, pp. 620-627.*

(Continued)

*Primary Examiner*—Phallaka Kik
(74) *Attorney, Agent, or Firm*—Fleshner & Kim, LLP

(57) ABSTRACT

A method for facilitating the sequential verification of loop-free circuits by reducing the sequential verification problem to combinational verification, by constructing and comparing Timed Binary Decision. Diagrams (TBDDs) and Timed Binary Expression Diagrams (TBEDs). The TBEDs can be compared by using both BDDs and SAT solvers.

18 Claims, 3 Drawing Sheets

OTHER PUBLICATIONS

Khasidashvill et al., "An enhanced cut-points algorithm in formal equivalence verification", Proceedings of Sixth IEEE International High-Level Design Validation and Test Workshop, Nov. 7, 2001, pp. 171-176.*

Matthew W. Maskewicz, Conor F. Madigan, Ying Zhao, Lintao Zhang, Sharad Malik; Chaff: Engineering an Efficient SAT Solver; Jun. 2001, 530-535; DAC, Las Vegas, Nevada, USA.

R.K. Ranjan, V. Singhal, F. Somenzi, and R.K. Brayton. Using combinational verification for sequential circuits, in: Proc. of Design, Automation and Test in Europe Conference, DATE'99, Mar. 9, 1999, pp. 138-144.

Bischoff et al., "Formal Implementation Verification of the Bus Interface Unit for the Alpha 21264 Microprocessor", Proc. of 1997 IEEE International Conference on Computer Design: VLSI in Computers and Processors, Oct. 12, 1997, pp. 16-24.

Rajeev Kumar Ranjan; Deisng and Implementation Verification of Finite State Systems; Fall 1997; pp. 1-330; University of California, Berkeley, California.

Z. Khasidashvili, J. Moondanos, Z. Hanna. TRANS: Efficient Sequential Verification of Loop-Free Circuits. in: Proc. of IEEE International High Level Design Validation and Test Workshop, HLDVT'02, IEEE Computer Society Press, 2002, p. 115-120, Oct. 27-29, 2002.

* cited by examiner

APPLICATION OF THE RETIMED NORMAL FORM TO THE FORMAL EQUIVALENCE VERIFICATION OF ABSTRACT RTL DESCRIPTIONS FOR PIPELINED DESIGNS

BACKGROUND OF THE INVENTION

1. Field of the Invention

The field of invention generally relates to formal equivalence verification tools and analyzing logic circuit models within a mathematical framework and more particularly, to an efficient method for performing sequential verification of loop-free circuits.

2. Background of the Related Art

Formal Equivalence Verification (FEV) tools are used to establish the equivalence of logic circuit models by analyzing them within a mathematical framework, thereby eliminating the need to resort to computationally intensive simulation of the circuits with very large numbers of inputs.

The logic design process can be viewed as a series of circuit model transformations that proceed from abstract Register Transfer Level (RTL) descriptions down to transistor level netlists. One of the factors upon which the correctness of the final, low level, implementation of the circuit depends upon, is the establishment of the equivalence of circuit models at differing levels of abstraction. Abstraction refers to the different levels of partition and hierarchy that may be used to model a circuit or a system under test. Two examples of different levels of abstraction are RTL and schematic levels.

FEV tools help to establish the equivalence of logic circuit models by analyzing them within a mathematical framework, without resorting to simulating a large number of input patterns. Frequently, the tools compare sequential logic circuit models that differ in terms of the number and placement of the state elements they contain. This is a direct consequence of the requirement to raise the level of abstraction for circuit descriptions and to improve the productivity of the front-end design activities. The performance of the classic formal equivalence verification algorithms drops significantly, as the number of state elements increases. As a result of this performance penalty, specialized algorithms have been developed that have increased performance for certain common categories of circuits. One such category of circuits includes pipelined loop-free circuits. The claimed embodiments of the present invention are concerned with the verification of pipelined loop-free circuits.

The related art approaches to verification of pipelined loop-free circuits has several disadvantages. The Boolean formulas that model circuit behavior are represented using binary decision diagrams (BDDs). Therefore, these approaches suffer from the well known limitations of BDDs (e.g. memory explosion). Furthermore, related art clocking schemes are rather simplistic (see R. K Ranjan, V. Singhal, F. Somenzi, and R. K Brayton, "*Using Combinational Verification for Sequential Circuits*" in Proceedings of Design, Automation and Test in Europe Conference, 1999).

Also, some related art approaches can only accommodate circuits with edge-triggered flip-flops (see G. P. Bischoff, K. S. Brace, S. Jain, and R. Razdan, "*Formal Implementation Verification of the Bus Interface Unit for the Alpha* 21264 *Microprocessor*" in Proceedings of IEEE International Conference on Computer Design; VLSI in Computers and Processors, 1997 and R.K Ranjan, "*Design and Implementation Verification of Finite State Systems*", Ph.D. Thesis, Univ. of California, Berkeley, 1997). The exemplary embodiments of the present invention address many of these aforementioned problems.

In the claimed embodiments of the present invention, the Boolean formulas that model circuit behavior are represented using Binary Expression Diagrams. These Boolean formulas are called Timed Binary Expression Diagrams ABED). As a result of using this type of Boolean representation, the functionality of very complex circuits can be modeled without suffering from exponential memory requirements associated with the use of binary decision diagrams (BDDs). The comparison of formulas represented as Binary Expression Diagrams is performed with a satisfiability (SAT) solver.

The combinational properties on the circuit inputs as well as on internal nodes are processed, and these properties are taken into account during the construction of TBEDs.

The new algorithm for TBED computation operates in a computationally efficient manner. During a test of one exemplary embodiment of the present invention, a 120× average speedup on complex circuits with respect to older versions employing TBED construction algorithms was achieved. One reason for the increased performance is that only one traversal of the latches is needed in the verified circuits, and for each latch, two relatively simple operations (a restrict operation and a shift operation) are performed. This means that it is not necessary to compute TBEDs with non-empty event lists.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Formal equivalence verification (FEV) tools are used to establish the equivalence of logic circuit models by analyzing them within a mathematical and logical analysis framework. This avoids the technical problems, complexities and drawbacks associated with simulating the very large number of input patterns that correspond to circuits having a computationally significant level of difficulty and complexity.

In many automated design verification techniques, finite state machines are used to model the behavior of systems with a finite number of states. In one exemplary scenario, the states are defined by the values of the latches in the circuit and the transitions among the various states are determined by the input and latch values. In some related art applications, successful verification occurs when the states of the circuit are successfully traversed. However, exemplary embodiments of the present invention are not based upon state space traversal.

The logic design process can be viewed as a series of circuit model transformations, as one progresses through various levels of abstraction. These levels of abstraction range from abstract resistor transistor logic (RTL) descriptions, down to transistor level netlists. This process permits a final, low level, implementation of the circuit so that equivalence of circuit models at differing levels of abstraction can be determined.

The performance of the classic formal equivalence verification algorithms drops significantly as the number of state elements (e.g. latches or flip-flops) making up the circuit under test or evaluation increases. As a result, specialized algorithms have been developed that have increased performance for certain common categories of circuits. One such exemplary category of circuits includes pipelined loop-free circuits.

One characteristic of a pipelined loop-free circuit is that the output of the circuit is the combinational function of the values of the inputs that flow across signal paths that are controlled by other signals.

Figure 1:
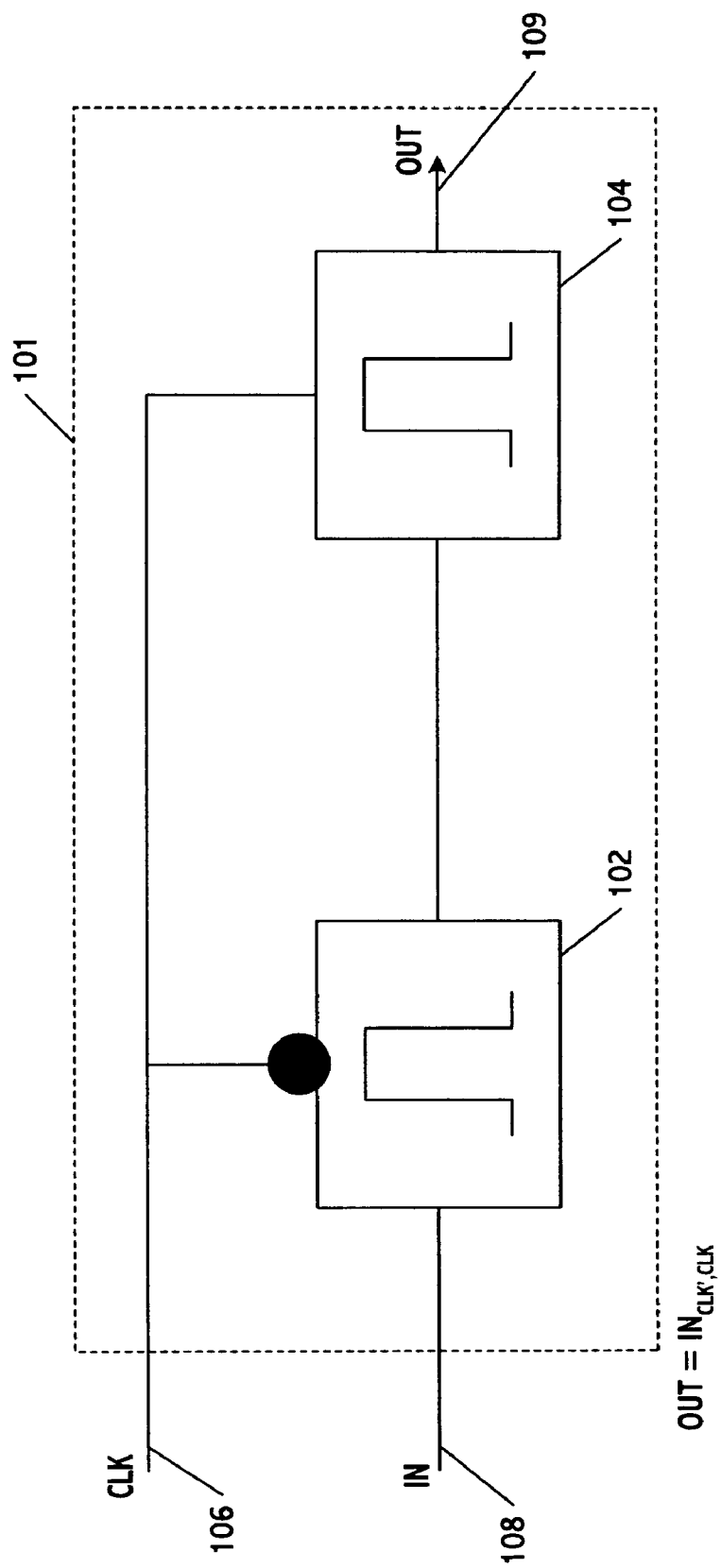
FIG. 1 is a diagram of an exemplary D flip-flop with master and slave latches.

FIG. 1 illustrates one exemplary embodiment of a pipelined loop-free circuit 101 that includes the master latch 102 and slave latch 104 of a D flip-flop. In FIG. 1, a clock signal 106 is applied to latches 102 and 104 with an input 108 and an output 109. The following equation can be used to represent the output (Out) 109 of the circuit.

Out=in[NOT Clk,Clk]

This means that the output Out 109 is equal to the value of the input signal at the last time the clock signal clk was low, prior to the clock signal becoming high again. The output of a sequential circuit without feedback loops can be similarly written as:

$$\sum_i \prod_j a^*_{j_{[e_{j1},e_{j2},\ldots e_{jk}]}} \quad (1)$$

(The * sign in Expression (1) stands for a possible negation.) The terms of the form:

$$a_{j_{[e_{j1},e_{j2},\ldots,e_{jk}]}} \quad (2)$$

are known as primitive RNFs and correspond to the value of $a_j$ at the last time signal $e_{j1}$ became high, before signal $ej_2$ became high, . . . , before $e_{jk}$ became high.

The list $[e_{j1}, e_{j2}, \ldots, e_{jk}]$ is called the event list of primitive RNF (2), and $a_j$ is called a timed Boolean variable. Expression (1) may be referred to as the Retimed Normal Form (RNF) for a sequential circuit, and circuits having equivalent RNFs may be considered as having the same functionality. In the related art, the counterparts of RNFs are called Timed (Ternary) Binary Decision Diagrams [see G. P. Bischoff, K. S. Brace, S. Jain, and R. Razdan, "*Formal Implementation Verification of the Bus Interface Unit for the Alpha* 21264 *Microprocessor*" in Proceedings IEEE International Conference on Computer Design, 1997] and Event Driven Boolean Functions, respectively [see R. K Ranjan, V. Singhal, F. Somenzi, and R. K Brayton, "*Using Combinational Verfcation for Sequential Circuits*" in Proceedings of Design, Automation and Test in Europe Conference, 1999]. However, circuits with the same functionality may possess different Retimed Normal Forms. This is possible, because the Retimed Normal Form captures the functionality of a circuit not only in terms of its logic gates, but also of its topological structure.

Figure 2:
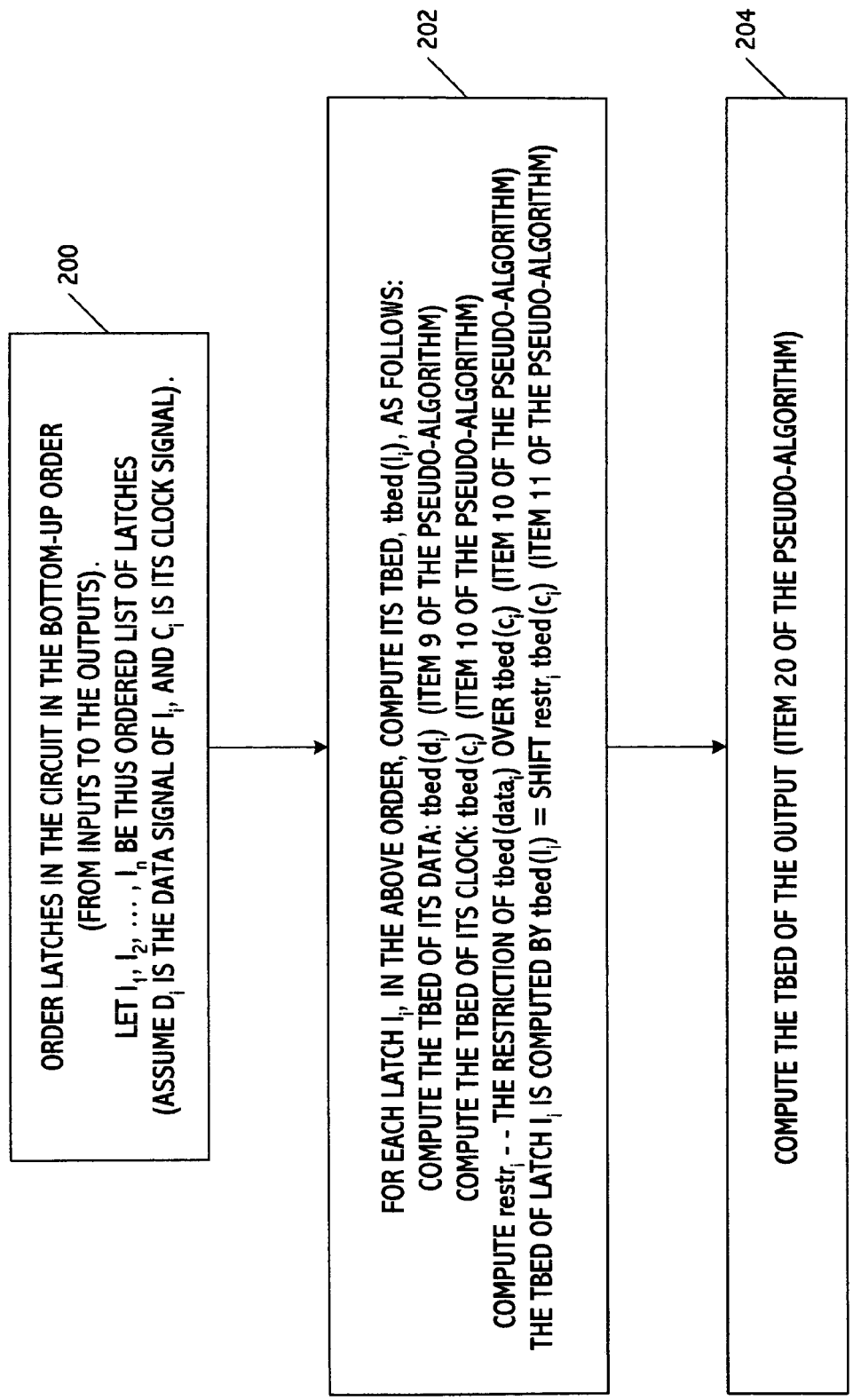
FIG. 2 is a block diagram of an exemplary embodiment of a method in accordance with the present invention.

FIG. 2 illustrates an example of a formal verification method in accordance with one exemplary embodiment of the present invention. In 200, latches are ordered in a bottom-up order. That is, state elements (e.g. latches and flip-flops) are ordered bottom-up, where the state elements that occur closest to the inputs are ordered first, and those state elements that occur closest to the output are ordered last. Therefore, in one exemplary embodiment, let $l_1$, $l_2$, . . . $l_n$ be an ordered list of latches and assume that $d_i$ is the data signal of $l_i$, and $c_i$ is its clock signal.

In 202, the following calculations are performed. For each latch $l_i$ in the above order a TBED, tbed $(l_i)$ is computed as follows. The TBED of its data, tbed $(d_i)$ is calculated in accordance with line 9 of the pseudo-code algorithm shown on page 11 of the specification. The TBED of its clock tbed $(c_i)$ is calculated in accordance with line 10 of the pseudo-code algorithm. The restriction of tbed(data$_i$) over tbed($c_i$) is calculated in accordance with line 10 of the pseudo-code algorithm. The TBED of latch $l_i$ is computed by TBED $(l_i)$=shift restr$_i$ tbed($c_i$) (line 11 of the pseudo-code algorithm).

In 204, the TBED of the output is computed (see line 20 of the pseudo-code algorithm).

The various circuits that will be verified are preferably represented as a Binary Expression Diagram (BED). One advantage of BEDs is that they can be compared using both BDD and SAT methods.

Timed Binary Expression Diagrams (TBEDs) are RNFs where primitive RNFs are replaced by fresh different variables, called parametric variables. In transitioning from RNFs to corresponding TBEDs, some circuit information is lost. As a result, since the claimed algorithm (and those algorithms in the related art) builds and compares TBEDs rather than RNFs, there is a possibility of false negatives occurring, because the TBEDs of equivalent circuits may not be equivalent. However, false positives should not occur, because if the TBEDs of exemplary circuits C1 and C2 are equivalent, then the circuits themselves are equivalent.

These characteristics enable the construction and comparison of the TBEDs with high efficiency, and allow for a proper treatment of user given assumptions. TBEDs are computed in the format of a BED, and SAT solvers and BDDs are used to establish the equivalence of TBEDs.

A BED is a representation of Boolean formulas that does not suffer from the memory explosion problem that is a characteristic of BDDs. BEDs do not have the canonicity property of BDDs. In order to check the equivalence of two BEDs, they must be translated into BDDs, or translated to another format accepted by SAT solvers.

Those skilled in the art will appreciate that SAT based methods perform better than BDDs on complex Boolean formulas. A SAT engine or solver attempts to find a satisfying assignment to a Boolean formula, or concludes that such an assignment does not exist.

A satisfying assignment for a formula A is an assignment of True or False to its variables, such that the value of A after the value substitution becomes True. For example, {x=True, y=False} is a satisfying assignment for formula x AND (NOT y)). SAT solvers can be used to establish the validity of a Boolean formula A, by trying to find a satisfying assignment to the negation of A−NOT A. If and only if NOT A can be satisfied, the formula A is not valid.

The TBEDs of output signals (e.g. pipelined loop-free circuits) are computed by taking into account user given properties on input as well as on internal signals. One example of the computational efficiency of one embodiment of the present invention is that TBED construction needs only one traversal over the latches. TBEDs of state elements and of the outputs are constructed in the bottom-up order, and therefore it visits each state element only once.

Traditionally, the TBED of a circuit is modeled as a binary decision diagram (BDD). There are two main verification applications of BDDs: combinational verification and sequential verification. In combinational verification, the objective is to create a corresponding BDD or BDDs for the outputs of a specific design (e.g. a circuit), so that these designs can be checked for equality. In sequential verification, the objective is to represent the behavior of the finite state machine and to traverse a state-transition graph that is a representation of the state machine that the specific design is representative of It is well known to those skilled in the art that BDDs suffer from increased memory requirements that render them inapplicable for many circuit applications (e.g. representing multiplier functionality). To overcome this limitation, TBED formulas are represented in a version of Binary Expression Diagrams (B-expressions). This is a representation that trades canonicity for smaller memory requirements. However, since this is not a canonical representation, B-expressions cannot be used to directly compare TBED formulas.

Instead, the B-expressions are converted into a format accepted by SAT solvers, and SAT solvers are used to establish the equivalence of the TBED formulas. This permits the verification of designs, that would otherwise be intractable by the application of classical techniques.

Another advantage of exemplary embodiments of the invention over the related art is the ability to handle combinational properties on input, as well as on internal, signals. Circuits contain properties and/or assumptions that specify the region of the Boolean space in which equivalence of a spec (specification) circuit model and an imp (implementation) circuit model must be established. Outside this region of the Boolean space, the models may differ, and this provides latitude for many optimizations during the synthesis process.

TBED formulas are computed so that they reflect the logic of the assumptions made during the model development process. One exemplary way of achieving this is to use a parametric constraint solver.

A parametric constraint solver receives a Boolean formula and an ordered set of variables as an input and returns an assignment to these variables that satisfies the formula. For example, given a formula ((a AND c) OR (b and d) OR (a OR c)) and a list [a,c,b,d] of variables occurring in it, a parametric solver will return the assignment [(a,a),(c,c),(b, b+!c&!a), (d,d+!c&!a)]. This assignment assigns a to a, c to c, b+!c&!a to b, and d+!c&!a to d) and this assignment satisfies the above formula. As a result, the equivalence checking is performed within the appropriate region of the Boolean space.

Unlike the existing algorithms in the related art, an exemplary algorithm of the present invention does not need to construct TBEDs with non-empty event lists, and no pending recursive calls (which consume extra memory) are needed. Two relatively simple operations (versus four or more in the existing algorithms) are needed to construct TBEDs for latches from already constructed TBEDs, and the relevant latch list is traversed only once, in a bottom-up (that is, from inputs toward the outputs) order.

One example of pseudo-code for implementing the TBED construction algorithm appears below.

```
1. Compute tbed(n) {
2.    / / This part computes TBEDs of all relevant latches
3.    ordered_latches : = order_bottom_-up (cone_latches)
4.    remaining_-latches := ordered_latches
5.    WHILE {remaining_latches is not empty}
6.       latch := head remaining_latches
7.       remaining_-latches := tail remaining_-latches
8.       IF{latch is latching data =G(l_1, . . . , l_m) on active control ctrl = H(l'_1 . . . , l'_k)}
9.          tbed(data) := G(tbed(l_1), . . . , tbed(l_m))
10.         tbed(ctrl) := H(tbed(l'_1), . . . , tbed(l'_k))
11.         restr := restrict tbed(data) tbed(ctrl)
12.         tbed(latch) : =shift restr tbed(ctrl)
13.      ENDIF
14. ENDWHILE
15.    / / Now it remains to compute the TBED of the output n
16.    IF {n=O(l*_1, . . . , l*_r)}
17.       IF {n is input}
18.          return P(n_[ ]);
19.       ELSE
20.          return O(tbed(l*1 ) . . . tbed(l*r))
21.       ENDIF
22. ENDIF
23. }
```

First of all, the exemplary pseudo-code orders the latches in a bottom up order which moves from the inputs to the outputs. The latches are ordered in a bottom up manner to compute TBED of a latch or a logic gate, TBEDs of the latch pins (e.g a data pin) or TBEDs of the inputs of the logic gate respectively. Computing the TBEDs in a bottom-up order helps to ensure that when a TBED of a circuit node is computed, all the needed TBEDs are already computed.

The exemplary algorithm traverses the ordered list of latches by always examining its leftmost element, which is also called the head of the list. The algorithm builds the TBED of that latch, removes it from the list, and moves on to the next element, which is the head of the remaining list.

In lines 9 and 10 of the pseudo-code, TBEDs of the pins of the currently examined latch is computed. In lines 11 and 12, the restriction and shift operation is applied to compute the TBED of the currently examined latch.

In line 20, once the TBEDs of all latches are computed after traversing the ordered latch list, the TBED of the output is computed by applying Boolean operations to the TBEDs of some of the computed latches. Line 18 refers to a degenerate case of a circuit which consists of an input only and does not contain any logic gates or latches. The restrict is an adaptation of a standard restrict operation that is applied on BDDs P( ) is a one to one mapping between primitive RNFs and a special set of parametric variables. Parametric variables are ordinary variables that are only used for the purpose of denoting primitive RNFs. The names of the parametric variables are chosen so that a node with the same name does not occur in the circuits that are to be verified. This is done so that the probability of false negatives is minimized, and the same parametric variable denotes the same or equivalent primitive RNFs. The shift operation updates parametric variables by inserting new events into the event lists of the corresponding primitive RNFs.

One application of the exemplary embodiments of the present invention is the verification of microprocessors and the pipelined circuits that make up these microprocessors. The increased performance and capacity of the disclosed algorithm enables the verification of complex pipelined circuits within formal mathematical frameworks. This helps to avoid or reduce the time-consuming simulation of input patterns on both specification and implementation models. The various embodiments of the present invention permit the ability to more efficiently establish that the logic behavior of larger and more complex pipelines actually complies with their corresponding specifications. This helps avoid the costly design errors and testing problems that delay the production of healthy, well-functioning processors.

At various stages of microprocessor design, the microprocessor is modeled at different levels of abstraction. To verify the equivalence of all or parts of two microprocessor designs using the claimed embodiments of the present invention, the designs are represented at the gate level. For example, gate level netlists can be produced from RTL or schematic representations of the design. Two gate level representations are compared by a tool implementing the claimed verification method and algorithm.

Figure 3:
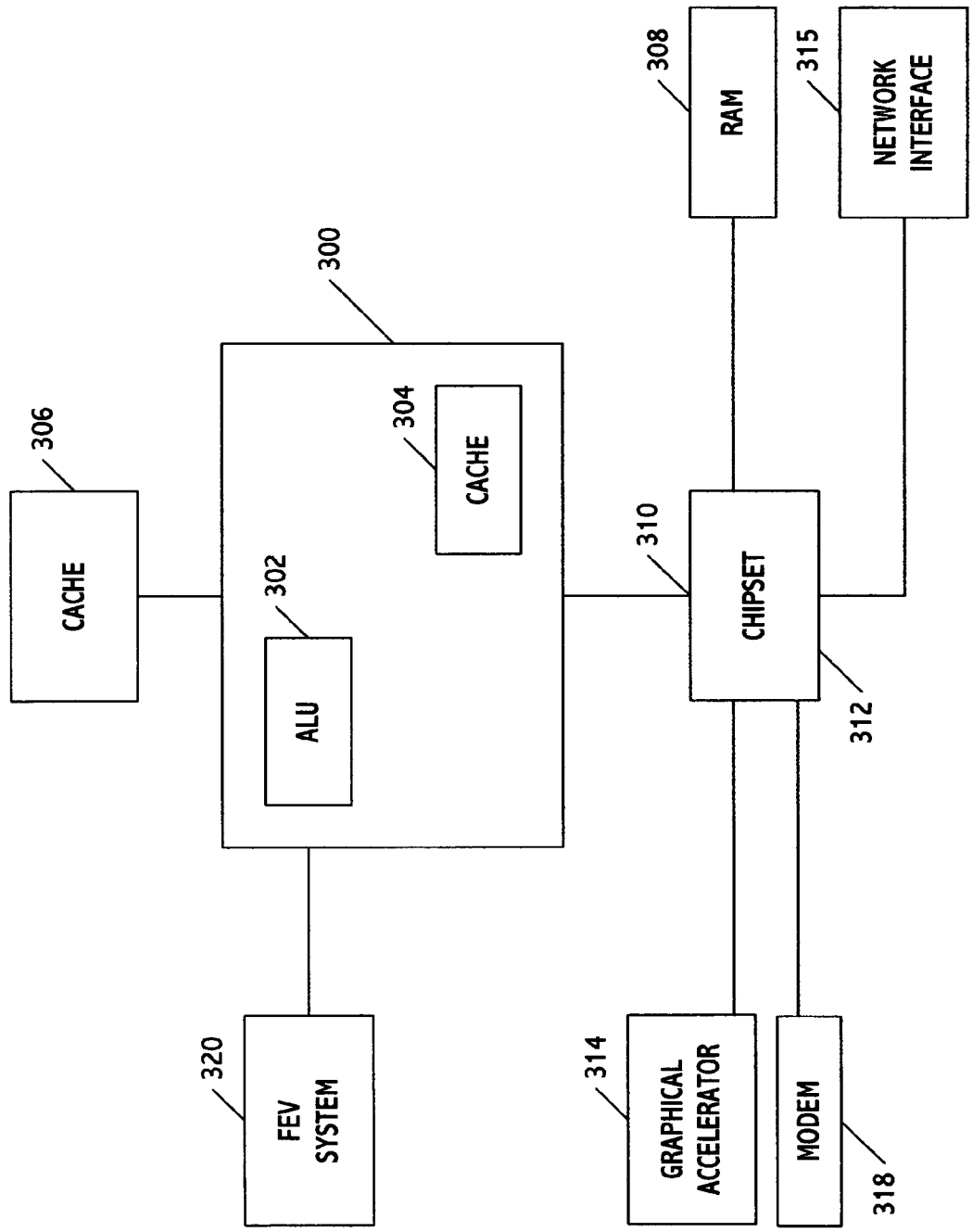
FIG. 3 is an exemplary system implementation of one embodiment of the present invention.

FIG. 3 illustrates an exemplary global illustration of a computer incorporating a system for performing FEV of pipelined designs. The computer system may include a microprocessor 300, which includes many sub-blocks, such as an arithmetic logic unit (ALU) 302 and an on-die cache 304. Microprocessor 300 may also communicate to other levels of cache, such as an off-die cache 306. Higher memory hierarchy levels such as system memory 308 (e.g. RAM), are accessed via a host bus 310 and chipset 312. In addition, other off-die functional units, such as a graphics accelerator 314, a network interface 315 and a modem 318, to name just a few, may communicate with the microprocessor 300 via appropriate busses, ports or other communication devices.

In FIG. 3, a formal equivalence verification system 320 is connected to the microprocessor or may be connected to gate level netlists that represent the design. Note that the formal equivalence verification system 320 and its interface to the item under test is exemplary in nature and may be interfaced or coupled with the computer system or item under test in various different configurations and locations without departing from the spirit and scope of the embodiments of the invention.

In another embodiment of the present invention, a computer readable media that implements an exemplary method of the present invention is disclosed. There is code that lists the latches in a predetermined order, code that represents the latch functions in a binary format and code that computes a Timed Binary Expresssion Diagram (TBED) using a binary format. Those skilled in the art will appreciate that this computer readable media may be implemented on any form of media (or combination thereof), such as a hard drive, CD, floppy disk, magnetic memory etc.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A formal equivalence verification method comprising:
    listing latches in a predetermined order;
    representing the latches in a binary format;
    computing a Timed Binary Expression Diagram (TBED) using the binary format; and
    verifying equivalence of a circuit using the computed TBED.

2. The method of claim 1, wherein the binary format is a Binary Expression Diagram (BED) format.

3. The method of claim 2, wherein the BED format is a graphical representation of a Boolean formula.

4. The method of claim 1, wherein the TBED is converted into a format accepted by a Satisfiability (SAT) solver.

5. The method of claim 4, wherein if the SAT solver shows that TBEDs of a plurality of circuits are equivalent then the circuits are also equivalent.

6. The method of claim 5, wherein the equivalence determined by the SAT solver is a steady-state equivalence.

7. The method of claim 6, wherein the SAT solver determines combinational equivalence of Boolean formulas.

8. The method of claim 7, wherein the Boolean formulas comprise the TBEDs corresponding to specification and implementation outputs.

9. The method of claim 1, wherein latches are traversed in a predetermined order and the latches are traversed to build TBEDs.

10. The method of claim 9, wherein the predetermined order selected and traversed is a bottom-up order that moves from inputs towards outputs.

11. The method of claim 10, wherein a relevant latch list is traversed once, according to the predetermined order.

12. The method of claim 9, wherein the TBED accounts for combinational properties on circuit inputs as well as any internal circuit nodes imposed by a user.

13. A system for performing formal equivalence verification comprising a processor that defines a state transition for one or more latches in a circuit, places the latches in a predetermined order, represents the latches in a binary format, computes a Timed Binary Expression Diagram (TBED) using the binary format, and verifying equivalence of a circuit using the computed TBED.

14. The system of claim 13 wherein the TBED is converted into a format accepted by a Satisfiability (SAT) solver.

15. A computer readable media having program code embedded therein, the program code comprising:
    code that lists latches in a predetermined order;
    code that represents latch functions in a binary format;
    code that computes a Timed Binary Expression Diagram (TBED) using the binary format; and
    code that verifies equivalence of a circuit using the computed TBED.

16. The computer readable media of claim 15, wherein the binary format is a Binary Expression Diagram (BED) format.

17. The computer readable media of claim 16, wherein the BED format is a graphical representation of a Boolean formula.

18. The computer readable media of claim 15, wherein the TBED is converted into a format accepted by a Satisfiability (SAT) solver.

* * * * *